(12) United States Patent
Ueno

(10) Patent No.: US 10,644,147 B2
(45) Date of Patent: May 5, 2020

(54) VERTICAL SEMICONDUCTOR DEVICE AND METHOD OF MANUFACTURING VERTICAL SEMICONDUCTOR DEVICE

(71) Applicant: FUJI ELECTRIC CO., LTD., Kanagawa (JP)

(72) Inventor: Katsunori Ueno, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/226,642

(22) Filed: Dec. 20, 2018

(65) Prior Publication Data

US 2019/0267486 A1    Aug. 29, 2019

(30) Foreign Application Priority Data

Feb. 28, 2018  (JP) .................................. 2018-034250

(51) Int. Cl.
| | |
|---|---|
| *H01L 29/66* | (2006.01) |
| *H01L 29/78* | (2006.01) |
| *H01L 29/417* | (2006.01) |
| *H01L 29/16* | (2006.01) |
| *H01L 29/20* | (2006.01) |

(52) U.S. Cl.
CPC ...... *H01L 29/7813* (2013.01); *H01L 29/1608* (2013.01); *H01L 29/2003* (2013.01); *H01L 29/41766* (2013.01); *H01L 29/66068* (2013.01); *H01L 29/7806* (2013.01); *H01L 29/7827* (2013.01)

(58) Field of Classification Search
CPC .................................................. H01L 29/7813
USPC ......................................................... 257/330
See application file for complete search history.

(56) References Cited

U.S. PATENT DOCUMENTS

| | | | |
|---|---|---|---|
| 5,614,749 A | 3/1997 | Ueno | |
| 6,621,107 B2 * | 9/2003 | Blanchard | ........... H01L 29/7813 257/155 |
| 7,816,732 B2 * | 10/2010 | Hsieh | .................. H01L 27/0629 257/334 |
| 2009/0272982 A1 * | 11/2009 | Nakamura | ........ H01L 29/66848 257/77 |
| 2009/0283776 A1 * | 11/2009 | Iwamuro | ............. H01L 29/7839 257/76 |

FOREIGN PATENT DOCUMENTS

| | | |
|---|---|---|
| JP | H08204179 A | 8/1996 |
| JP | 2009278067 A | 11/2009 |

* cited by examiner

*Primary Examiner* — Ajay Arora

(57) ABSTRACT

A vertical semiconductor device is provided, including a transistor region and a Schottky diode region, and having, in a gallium nitride layer in the Schottky diode region, a first well region, a diode trench portion that is provided in direct contact with the first well region in an array direction in which the transistor region and the Schottky diode region are arrayed, a first upper drift region that is connected to the bottom of the diode trench portion, a lower drift region that is connected to the bottom of the first well region and a bottom of the first upper drift region, and a conductive portion that is connected to an upper portion of the first upper drift region.

11 Claims, 13 Drawing Sheets

VERTICAL SEMICONDUCTOR DEVICE AND METHOD OF MANUFACTURING VERTICAL SEMICONDUCTOR DEVICE

The contents of the following Japanese patent application(s) are incorporated herein by reference:
NO. 2018-034250 filed in JP on Feb. 28, 2018.

BACKGROUND

1. Technical Field

The present invention relates to a vertical semiconductor device and a method of manufacturing the vertical semiconductor device.

2. Related Art

In a case where a Metal Oxide Semiconductor Field Effect Transistor (MOSFET) using gallium nitride (hereinafter, GaN) as a semiconductor material is used as a switching element of an inverter module, there is an operation mode in which forward current flows through a built-in PN junction of the GaN-MOSFET. If the forward current flows through the built-in PN junction of the GaN-MOSFET, light of a short wavelength (equivalent to 3.4 eV, for example) is generated by recombination of holes and electrons. Depending on the light emission at this built-in PN junction, the characteristics of the gate insulating film of the GaN-MOSFET change. Also, reliability of the gate insulating film is lowered due to implantation of carriers (for example, holes) into the gate insulating film. Note that regarding a silicon carbide (SiC) semiconductor device, a SiC semiconductor device having a MOSFET portion and a Schottky diode (also referred to as Schottky Barrier Diode; hereinafter, SBD) portion has been known (for example, see Patent Documents 1 and 2).

PRIOR ART LITERATURE

[Patent Document]
[Patent Document 1] Japanese Patent Application Publication No. 2009-278067
[Patent Document 2] Japanese Patent Application Publication No. Hei8-204179

SUMMARY

With respect to the recombination of the holes and the electrons, because SiC is of indirect transition type but GaN is of direct transition type, the light emission efficiency at the built-in PN junction in GaN is higher compared to that in SiC. In GaN-MOSFET, it is desirable to reduce an influence of the internal light emission.

In a first aspect of the present invention, a vertical semiconductor device is provided, having a gallium nitride substrate of a first conductivity type and a gallium nitride layer provided on the gallium nitride substrate. The vertical semiconductor device may include a transistor region and a Schottky diode region. The Schottky diode region may be in direct contact with the transistor region. The vertical semiconductor device may have, in the gallium nitride layer in the Schottky diode region, a first well region of a second conductivity type, a diode trench portion, a first upper drift region of a first conductivity type, a lower drift region of a first conductivity type and a conductive portion. The diode trench portion may be in direct contact with the first well region in an array direction. The array direction may be a direction in which the transistor region and the Schottky diode region are arrayed. The diode trench portion may be provided from an upper surface of the gallium nitride layer to a position shallower than a bottom of the first well region. The first upper drift region may be connected to a bottom of the diode trench portion. The lower drift region may be connected to the bottom of the first well region and a bottom of the first upper drift region. The conductive portion may be provided inside the diode trench portion. The conductive portion may be connected to an upper portion of the first upper drift region.

The vertical semiconductor device may have, in the gallium nitride layer in the transistor region, a gate trench portion, and a second upper drift region of a first conductivity type. The gate trench portion may be spaced from the diode trench portion in the array direction. The gate trench portion may be in direct contact with the first well region. The gate trench portion may be provided from the upper surface of the gallium nitride layer to a position shallower than the bottom of the first well region. The second upper drift region may be connected to the bottom of the gate trench portion. The lower drift region may also be connected to a bottom of the second upper drift region.

In a depth direction of the gallium nitride layer, the bottom of the diode trench portion may be provided at a position closer to the upper surface of the gallium nitride layer than the bottom of the gate trench portion.

Instead of this, in the depth direction of the gallium nitride layer, the bottom of the diode trench portion may also be provided at a position identical to that of the bottom of the gate trench portion.

In the array direction, a width of the diode trench portion may be larger than a width of the gate trench portion.

In the array direction, a width of the second upper drift region connected to the bottom of the gate trench portion may be smaller than a width of the first upper drift region connected to the bottom of the diode trench portion.

In the array direction, the width of the diode trench portion may also be smaller than the width of the gate trench portion.

The vertical semiconductor device may further include an ohmic electrode layer. The ohmic electrode layer may be at least in contact with the diode trench portion and the upper surface of the gallium nitride layer. The conductive portion provided inside the diode trench portion may be a metal conductive portion. The metal conductive portion may have a work function that is larger than that of the ohmic electrode layer.

The vertical semiconductor device may further have an embedded region of a second conductivity type. The embedded region may be provided between the first well region and the lower drift region.

The vertical semiconductor device may further include an edge termination region. The edge termination region may be provided so as to surround the transistor region and the Schottky diode region in a top view. The gallium nitride layer in the edge termination region may have a second well region of a second conductivity type, an edge trench portion, a third upper drift region of a first conductivity type and an insulating film. The edge trench portion may be in direct contact with the second well region in the array direction. The edge trench portion may be provided from the upper surface of the gallium nitride layer to a position shallower than a bottom of the second well region. The third upper drift region may be connected to a bottom of the edge trench portion. The insulating film may be provided inside the edge trench portion. The insulating film may be connected to the third upper drift region. The lower drift region may also be connected to a bottom of the third upper drift region.

In a second aspect of the present invention, a method of manufacturing a vertical semiconductor device having a transistor region and a Schottky diode region in direct contact with the transistor region is provided. The method of manufacturing the vertical semiconductor device may include a step of epitaxially forming a gallium nitride layer, an etching step of forming a trench, a step of implanting dopants of a first conductivity type, and a step of forming a diode conductive portion inside the trench. The gallium nitride layer may at least have, on the gallium nitride substrate of a first conductivity type, a first gallium nitride layer of a first conductivity type and a second gallium nitride layer of a second conductivity type. The trench may be formed from the upper surface of the gallium nitride layer to a position shallower than a bottom of the second gallium nitride layer. The step of implanting dopants of a first conductivity type may be a step of implanting the dopants of a first conductivity type at least between the trench and the first gallium nitride layer to form the upper drift region of a first conductivity type. The upper drift region may be connected to the bottom of the trench and the upper portion of the first gallium nitride layer. The diode conductive portion may be connected to the upper drift region at the bottom of the trench. The diode conductive portion may be the conductive portion of the Schottky diode region.

The summary clause does not necessarily describe all necessary features of the embodiments of the present invention. Also, the present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In the present specification, N or P respectively means that electrons or holes are majority carriers. Also, regarding the mark "+" or "−" added to the right side of N or P, the mark "+" means a carrier concentration when the mark "+" is added higher than that when not added, and the mark "−" means a carrier concentration when the mark "−" is added lower than that when not added. In an example described in the present specification, a first conductivity type is defined as N type and a second conductivity type is defined as P type. However, in another example, a first conductivity type may also be defined as P type and a second conductivity type may also be defined as N type.

In an example described in the present specification, the X axis and the Y axis are axes orthogonal to each other, and the Z axis is an axis orthogonal to an X-Y plane. The X, Y and Z axes form a so-called right-hand system. For example, in the vertical GaN-MOSFET 100, a lower surface of a GaN substrate and an upper surface of an epitaxial GaN layer are respectively parallel to the X-Y plane. Note that in the present specification, a Z-axis positive direction (+Z direction) may be referred to as an "upper" direction, and a Z-axis negative direction (−Z direction) may be referred to as a "lower" direction. Note that the "upper" and the "lower" directions do not necessarily mean a direction vertical to the ground. That is, the "upper" and the "lower" directions are not limited to the gravity direction. The terms "upper" and "lower" are merely convenient expressions to specify a relative position relation between regions, layers, films, substrates and the like.

Although the semiconductor device described in the present specification has GaN as the semiconductor material, the semiconductor device may also have GaN containing one or more elements of aluminum (Al) and indium (In) as the semiconductor material. That is, the semiconductor device may also have $Al_xIn_yGa_{1-x-y}N$ ($0 \leq x < 1$, $0 \leq y < 1$) (that is, GaN-based semiconductor) that is a mixed crystal semiconductor containing a slight amount of Al and In as the semiconductor materials. Note that the semiconductor material in the present specification is GaN being $Al_xIn_yGa_{1-x-y}N$, where x=y=0.

P type dopants to GaN may be one or more types of elements of magnesium (Mg), calcium (Ca), beryllium (Be) and zinc (Zn). In the present specification, magnesium is used as the P type dopants. Also, N type dopants to GaN may be one or more types of elements of Si (silicon), Ge (germanium), and O (oxygen). In the present specification, silicon is used as the N type dopants.

Figure 1:
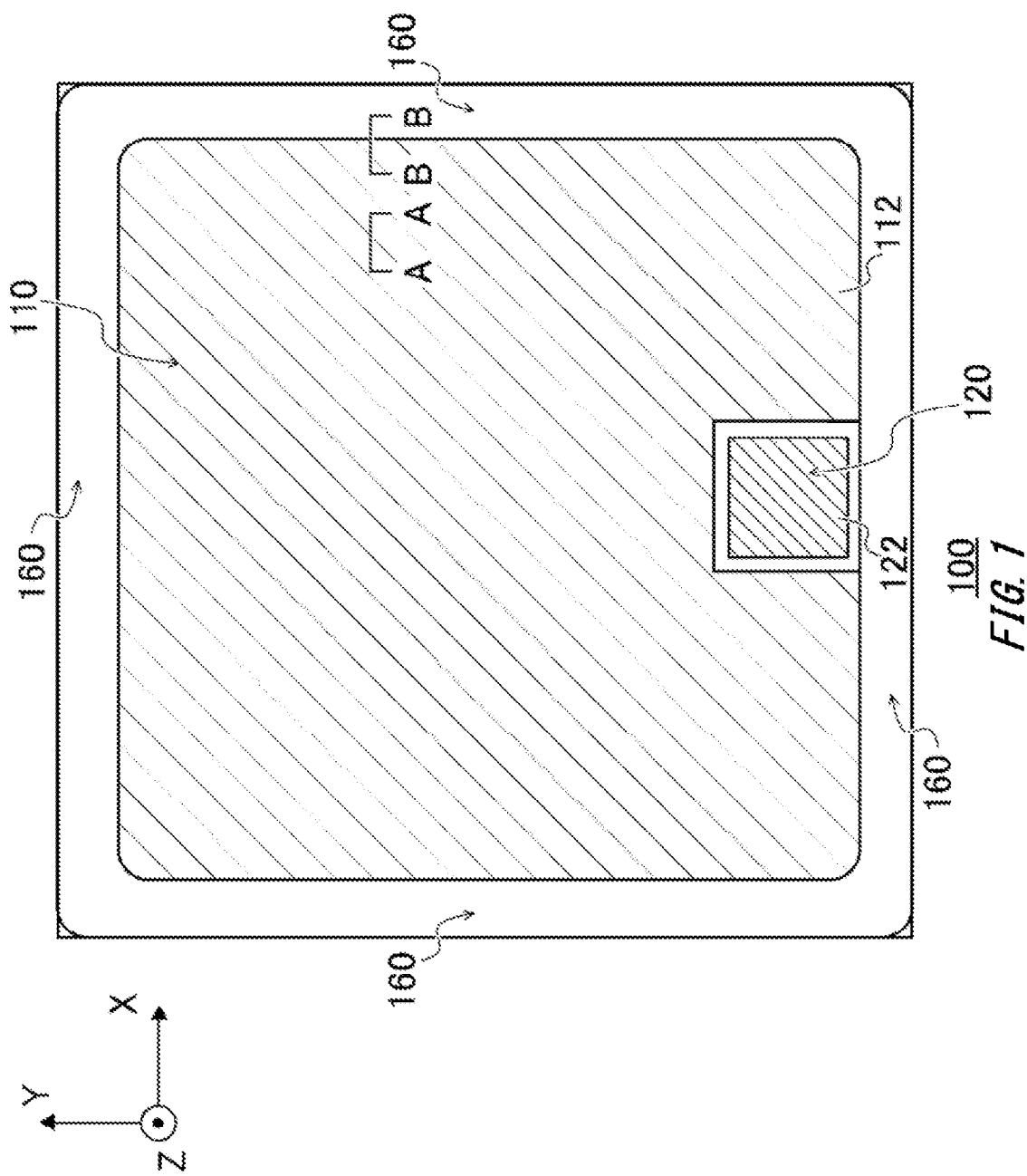
FIG. 1 shows a schematic view of an upper surface of a vertical GaN-MOSFET 100.

FIG. 1 is a schematic view showing an upper surface of a vertical GaN-MOSFET 100. The vertical GaN-MOSFET 100 may be a semiconductor device used for a high-breakdown-voltage power semiconductor device. That is, the vertical GaN-MOSFET 100 may be a high-breakdown-voltage semiconductor device that is not broken even if a reverse bias of equal to or greater than 100V is applied to the P-N junction portion when the vertical GaN-MOSFET 100 is incorporated in an inverter module.

The vertical GaN-MOSFET 100 in the present example has an active region 110, a pad region 120 and an edge termination region 160. The active region 110 may have a MOSFET region and a SBD region that are described below. The active region 110 may be provided with a source pad 112, and the pad region 120 may be provided with a gate pad 122. The source pad 112 may correspond to a source electrode described below and the gate pad 122 may be a metal layer that is electrically connected to a gate conductive portion described below.

The edge termination region 160 may be provided so as to surround the active region 110 and the pad region 120 in a top view. The edge termination region 160 may have a function of relaxing electric field concentration on the upper surface side of the epitaxially-formed GaN layer that configures the vertical GaN-MOSFET 100. For example, the edge termination region 160 has a function of preventing the electric field concentration in the active region 110 by having a depletion layer generated in the active region 110 spread to a peripheral end portion of the GaN layer. The edge termination region 160 may have a structure of any one of a guard ring, a field plate and a resurf, or a structure obtained by combining two or more thereof.

Figure 2:
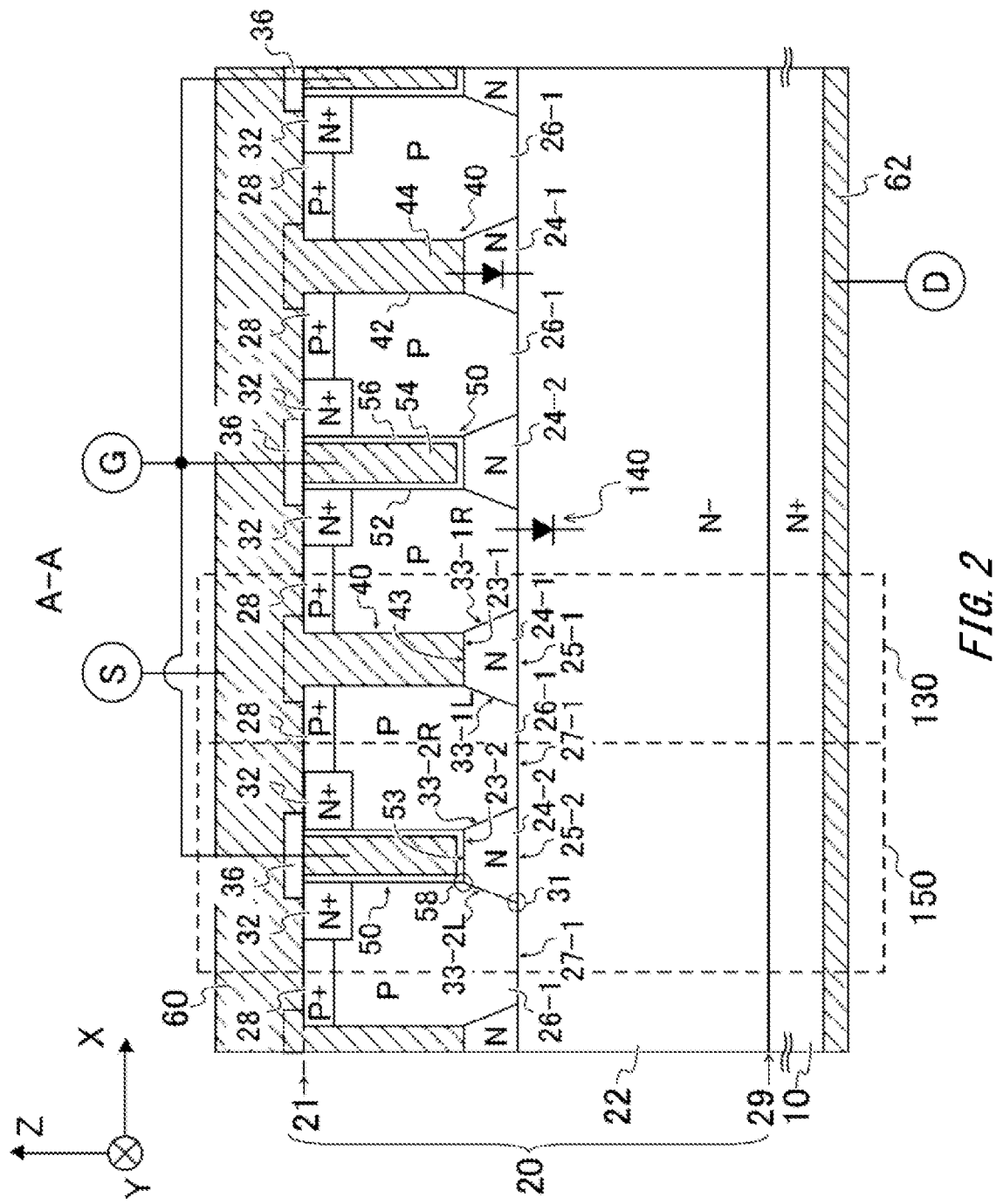
FIG. 2 shows a cross-section A-A of FIG. 1 in a first embodiment.

FIG. 2 is a drawing showing a cross-section A-A of FIG. 1 in a first embodiment. The cross-section A-A is a cross section passing through the active region 110 and being parallel to the X-Z plane. The vertical GaN-MOSFET 100 in the present example is a SBD built-in MOSFET in which a SBD region 130 and a MOSFET region 150 are included in one GaN semiconductor chip. The vertical GaN-MOSFET 100 has an N+ type GaN substrate 10, a GaN layer 20, an interlayer dielectric film 36, a source electrode 60 and a drain electrode 62.

The GaN layer 20 is an epitaxial layer provided on the GaN substrate 10. The GaN layer 20 has an upper surface 21 that is in contact with the source electrode 60, and a lower surface 29 that is in contact with the GaN substrate 10. Also, the GaN layer 20 includes an N-type lower drift region 22, N type upper drift regions 24-1 and 24-2, a P type well region 26-1, a P+ type contact region 28, an N+ type source region 32, a gate trench portion 50 and a diode trench portion 40. Note that the upper drift region 24-1 is one example of the first upper drift region, and the upper drift region 24-2 is one example of the second upper drift region. Also, the well region 26-1 is one example of the first well region 26.

The vertical GaN-MOSFET 100 in the present example has the SBD region 130 and the MOSFET region 150 that are alternately arranged in the X-axis direction. Note that the SBD region 130 is one example of the Schottky diode region in direct contact with the MOSFET region 150, and the MOSFET region 150 is one example of the transistor region. On the cross-section A-A, the array direction in which the SBD region 130 and the MOSFET region 150 are arrayed is parallel to the X-axis direction.

The SBD region 130 in the present example includes at least a diode trench portion 40, an N-type lower drift region 22 and an N type upper drift region 24-1. The diode trench portion 40 may be provided in direct contact with the well region 26-1 in the X-axis direction and between two well regions 26-1. The diode trench portion 40 in the present example is provided from an upper surface 21 of the GaN layer 20 to a position shallower than a bottom 27-1 of the well region 26-1. By providing a bottom 43 of the diode trench portion 40 at a position closer to the upper surface 21 than a bottom 27-1 of the well region 26-1, when a reverse bias is applied to the P-N junction portion, the depletion layer easily spreads in a region that is between the well regions 26-1 adjacent to each other, the region being below the diode trench portion 40. For that reason, the breakdown voltage can be improved, compared to a case where the bottom 43 of the diode trench portion 40 is at a depth that is the same as or that is larger than that of the bottom 27-1 of the well region 26-1. Note that the P-N junction portion is a P-N junction portion formed with the P type well region 26, the upper drift region 24 and the lower drift region 22, for example.

The diode trench portion 40 in the present example has a diode trench 42 that is formed by etching the GaN layer 20 from the upper surface 21 to a predetermined depth, and a diode conductive portion 44 that is filled inside the diode trench 42 and that is also provided on the upper surface 21 of the GaN layer 20. The bottom 43 of the diode trench portion 40 may be connected to an upper portion 23-1 of the upper drift region 24-1. In the SBD region 130 in the present example, a metal semiconductor junction is formed by connecting the diode conductive portion 44 to the upper portion 23-1 of the upper drift region 24-1. The diode conductive portion 44 may serve as an anode of the SBD region 130. Also, the source electrode 60 may serve as an anode electrode of the SBD region 130.

The well region 26-1 in the present example is a part of the P type GaN layer epitaxially formed on the lower drift region 22. On the other hand, the upper drift regions 24-1 and 24-2 in the present example are N type regions formed by counter doping, with the N type dopants, a part of the P type GaN layer configuring the well region 26-1.

The lower drift region 22 is a part of the N type epitaxial layer formed on the GaN substrate 10. The lower drift region 22 is connected to the bottom 27-1 of the well region 26-1 and the bottom 25-1 of the upper drift region 24-1. The lower drift region 22, the upper drift region 24-1 and the GaN substrate 10 may serve as cathodes of the SBD region 130. Also, the drain electrode 62 may serve as a cathode electrode.

The MOSFET region 150 in the present example at least includes the gate trench portion 50, the N+ type source region 32, the P+ type contact region 28, the N-type lower drift region 22 and the N type upper drift region 24-2. The gate trench portion 50 is spaced from the diode trench portion 40 in the X-axis direction, and is in direct contact with the well region 26-1 that is in direct contact with the diode trench portion 40. In the same manner as that of the diode trench portion 40, the gate trench portion 50 is also provided between two well regions 26-1.

The gate trench portion 50 in the present example is formed partially in the same manner as that of the diode trench portion 40. In the present example, the bottom 53 of the gate trench portion 50 is provided at the same position as that of the bottom 43 of the diode trench portion 40 in the Z-axis direction. Note that the Z-axis direction is one example of a depth direction of the GaN layer 20. In the present example, because the gate trench portion 50 is formed partially by the same step as that of the diode trench portion 40, the present example is advantageous in terms of manufacturing time and manufacturing cost, compared to a case where the gate trench portion 50 is formed at an individually different depth.

The gate trench portion 50 in the present example has the gate trench 52, the gate insulating film 56 that is provided in contact with the bottom 53 and side walls of the gate trench 52, and the gate conductive portion 54 that is in contact with the gate insulating film 56 and that is filled inside the gate trench 52. Note that the interlayer dielectric film 36 is provided on the upper portion of the gate trench portion 50. By the interlayer dielectric film 36, the gate conductive portion 54 and the source electrode 60 are electrically isolated from each other.

The bottom 53 of the gate trench portion 50 may be connected to the upper portion 23-2 of the upper drift region 24-2. Also, the lower drift region 22 may be connected to the bottom 25-2 of the upper drift region 24-2. The upper drift region 24-2 and the lower drift region 22 may serve as paths through which current flows during a gate-on period.

In the present example, the width of the bottom 53 of the gate trench portion 50 in the X-axis direction is smaller than the width of the bottom 25-2 of the upper drift region 24-2 in the X-axis direction. For that reason, side portions 33-2L and 33-2R of the upper drift region 24-2 are inclined, relative to the Z axis, from an end portion of the bottom 53 of the gate trench portion 50 in the X-axis direction toward an end portion of the bottom 25-2 of the upper drift region 24-2 in the X-axis direction. Accordingly, in the MOSFET region 150 in the present example, the current can flow so that the path of the current expands in the X-axis direction as the current advances in a Z-axis negative direction during the gate-on period. In the present example, because the path of the current can expand compared to a case where the widths of the bottom 53 and the bottom 25-2 in the X-axis direction are the same as each other, internal resistance of the MOSFET region 150 can be reduced.

In the present example, the upper drift region 24-1 and the upper drift region 24-2 have the same shape. That is, the width of the bottom 53 of the gate trench portion 50 in the X-axis direction is the same as that of the bottom 43 of the diode trench portion 40 in the X-axis direction, and the width of the bottom 25-1 of the upper drift region 24-1 in the X-axis direction is also the same as that of the bottom 25-2 of the upper drift region 24-2 in the X-axis direction. For that reason, the width of the bottom 43 of the diode trench portion 40 in the X-axis direction is also smaller than the width of the bottom 25-1 of the upper drift region 24-1 in the X-axis direction as well. Note that in another example, the width of the bottom 43 of the diode trench portion 40 in the X-axis direction may also be the same as that of the bottom 25-1 of the upper drift region 24-1 in the X-axis direction. This case is advantageous in that the depletion layer more easily spreads when the reverse bias is applied to the P-N junction portion, compared to a case where the width of the bottom 43 in the X-axis direction is smaller than that of the bottom 25-1 in the X-axis direction.

Also, in the same manner as that of the diode trench portion 40, the gate trench portion 50 in the present example is also provided from the upper surface 21 of the GaN layer 20 to a position shallower than the bottom 27-1 of the well region 26-1. Accordingly, when the reverse bias is applied to the P-N junction portion, the electric field concentration is more easily generated in the vicinity of a corner 31 of the bottom 27-1 of the well region 26-1 compared to the vicinity of a corner 58 of the bottom 53 of the gate trench portion 50. For that reason, even if the breakdown occurs it is not the corner 58 but the corner 31 broken. Accordingly, the gate insulating film 56 can be prevented from being broken. Note that once the gate insulating film 56 is broken, the MOSFET loses its function. On the other hand, even if the vicinity of the corner 31 of the well region 26-1 is broken due to the electric field concentration, because a gate threshold voltage and the like are not affected, the function of the MOSFET can be maintained.

Also, if the breakdown occurs due to the electric field concentration, the corner 31 of the well region 26-1 is broken. For that reason, compared to a case where the corner 58 of the gate trench portion 50 is broken, according to in the present example, the breakdown occurs at a position away from the source region 32. Accordingly, compared to a case where the corner 58 of the gate trench portion 50 is broken, a parasitic PNP transistor can be more surely prevented from being turned on due to the breakdown current flowing through the source region 32.

In the gate-on state (in the present example, when a predetermined positive voltage is applied to the gate conductive portion 54), a charge inversion layer is formed on the well region 26-1 (that is, a channel forming region) in the vicinity of the side walls of the gate trench portion 50. At this time, as a predetermined potential difference is provided between the source electrode 60 and the drain electrode 62, the current flows from the drain electrode 62 through the GaN substrate 10, the lower drift region 22, the upper drift region 24-2, the charge inversion layer and the source region 32 to the source electrode 60. On the other hand, in a gate-off state (in the present example, when a predetermined negative voltage or zero voltage is applied to the gate conductive portion 54), the charge inversion layer is eliminated, and no current flows between the source electrode 60 and the drain electrode 62.

The P type well region 26-1, and the N type upper drift regions 24-1 and 24-2 and the N-type lower drift region 22 form the P-N junction. In the present specification, the P-N junction is referred to as a body diode 140. For an operation of the inverter module, potential $V_D$ of the drain electrode 62 may be lower than potential $V_S$ of the source electrode 60. For example, there is an operation mode in which a negative bias is applied to the drain electrode 62 and a positive bias is applied to the source electrode 60. Generally, a forward-direction voltage $V_F$ of the SBD region 130 is lower than a forward-direction voltage $V_F$ of the body diode 140. For that reason, in the present example, in a case where $V_D$ is lower than $V_S$, the current flows through the SBD region 130 not the body diode 140.

If the current flows through the body diode 140, holes and electrons both flow through the body diode 140. Accordingly, an internal light emission is generated due to the recombination of the holes and the electrons. On the other hand, because the current flowing through the SBD region 130 is mainly electron current, the internal light emission problem can be reduced, compared to a case where the current flows through the body diode 140. Also, because the current flows through the SBD region 130 in which the forward-direction voltage $V_F$ is relatively low, a power loss of the diode when the current is applied thereto can be reduced, compared to the case where the current flows through the body diode 140.

Further, because the vertical GaN-MOSFET 100 in the present example is a SBD built-in MOSFET, it is not necessary to separately provide a semiconductor chip for MOSFET and a semiconductor chip for diode in the inverter module. For that reason, compared to a case where the semiconductor chips are separately used, the present example is advantageous in that miniaturization of the inverter module can be achieved.

Although a ratio of a proportion of the MOSFET region 150 to that of the SBD region 130 in the active region 110 shown on the cross-section A-A is 1:1, the proportion of the MOSFET region 150 may also be higher than the proportion of the SBD region 130. The ratio of the proportion of the MOSFET region 150 to that of the SBD region 130 may be 2:1 to 3:1. By making the proportion of the MOSFET region 150 high, a rated current during the gate-on period of the vertical GaN-MOSFET 100 can be increased, compared to a case where the proportion of the MOSFET region 150 and that of the SBD region 130 are the same.

On the cross-section A-A, an area of each unit cell of each of the MOSFET region 150 and the SBD region 130 is shown by broken lines. A length of the unit cell in the X-axis direction is, for example, 10 μm. Each unit cell in the present example is in a striped shape extending in the Y-axis direction. However, in another example, the gate trench portion 50 of the MOSFET region 150 may be provided in a honeycomb shape on the X-Y plane, and the diode trench portion 40 of the SBD region 130 may be provided at least to any one of the inside and the outside of the hexagonal gate trench portion 50.

Figure 3A:
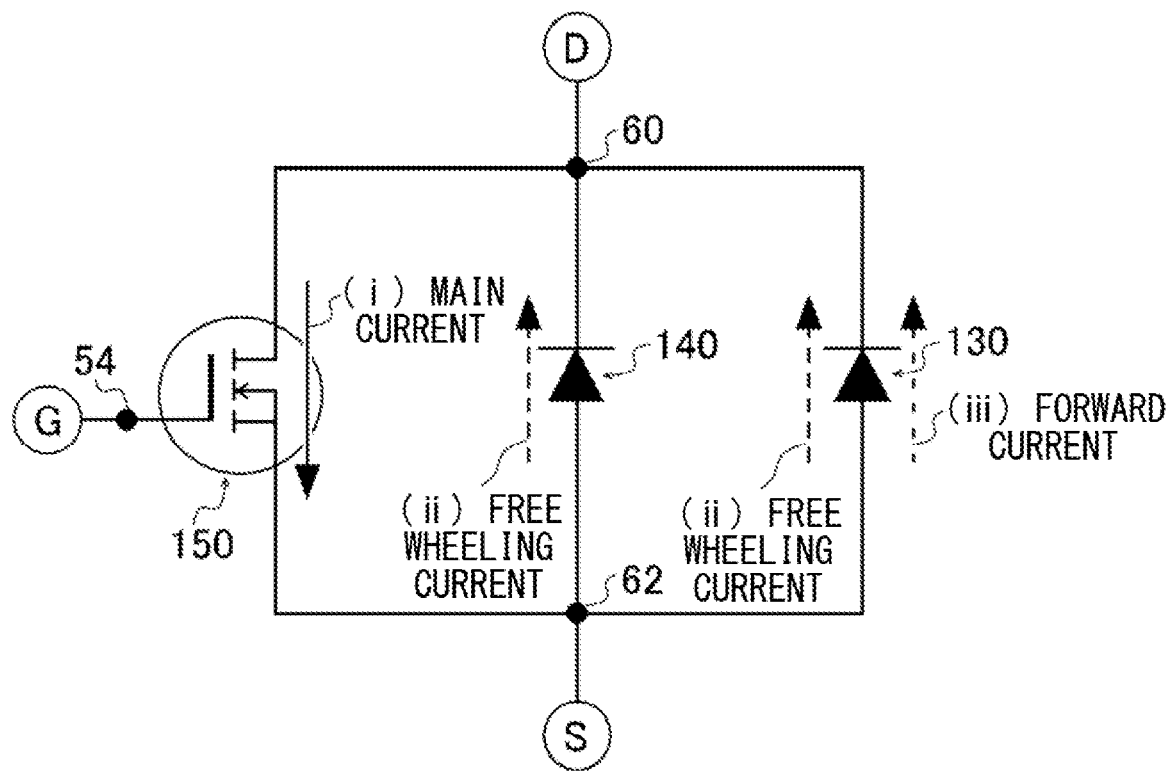
FIG. 3A shows an equivalent circuit diagram of the vertical GaN-MOSFET 100.

FIG. 3A is an equivalent circuit diagram of the vertical GaN-MOSFET 100. The SBD region 130, the body diode 140 and the MOSFET region 150 are mutually connected in parallel between a source and a drain. In the vertical GaN-MOSFET 100 in the present example, when a forward bias is applied between the source and the drain ($V_S<V_D$), (i) main current flows through the MOSFET region 150. Also, when a reverse bias is applied between the source and the drain ($V_D<V_S$), (ii) free wheeling current flows through the SBD region 130 and the body diode 140. Note that as described above, when $V_D<V_S$ (that is, the forward bias is applied to the P-N junction portion), the state is the gate-off state and the current flows between the source and the drain, (iii) the forward current flows through the SBD region 130 not the body diode 140. Accordingly, the GaN internal light emission problem can be reduced. Also, when no current flows through the body diode 140 and the forward current flows through the SBD region 130 only, almost no holes and electrons being minority carriers are accumulated within the lower drift region 22. For that reason, when the reverse bias is applied to the P-N junction portion, because no tail current flows through the body diode 140, the body diode 140 may also be switched to a current cutoff state (that is, a state in which the depletion layer is formed) at a speed approximately the same as that of the SBD region 130.

Figure 3B:
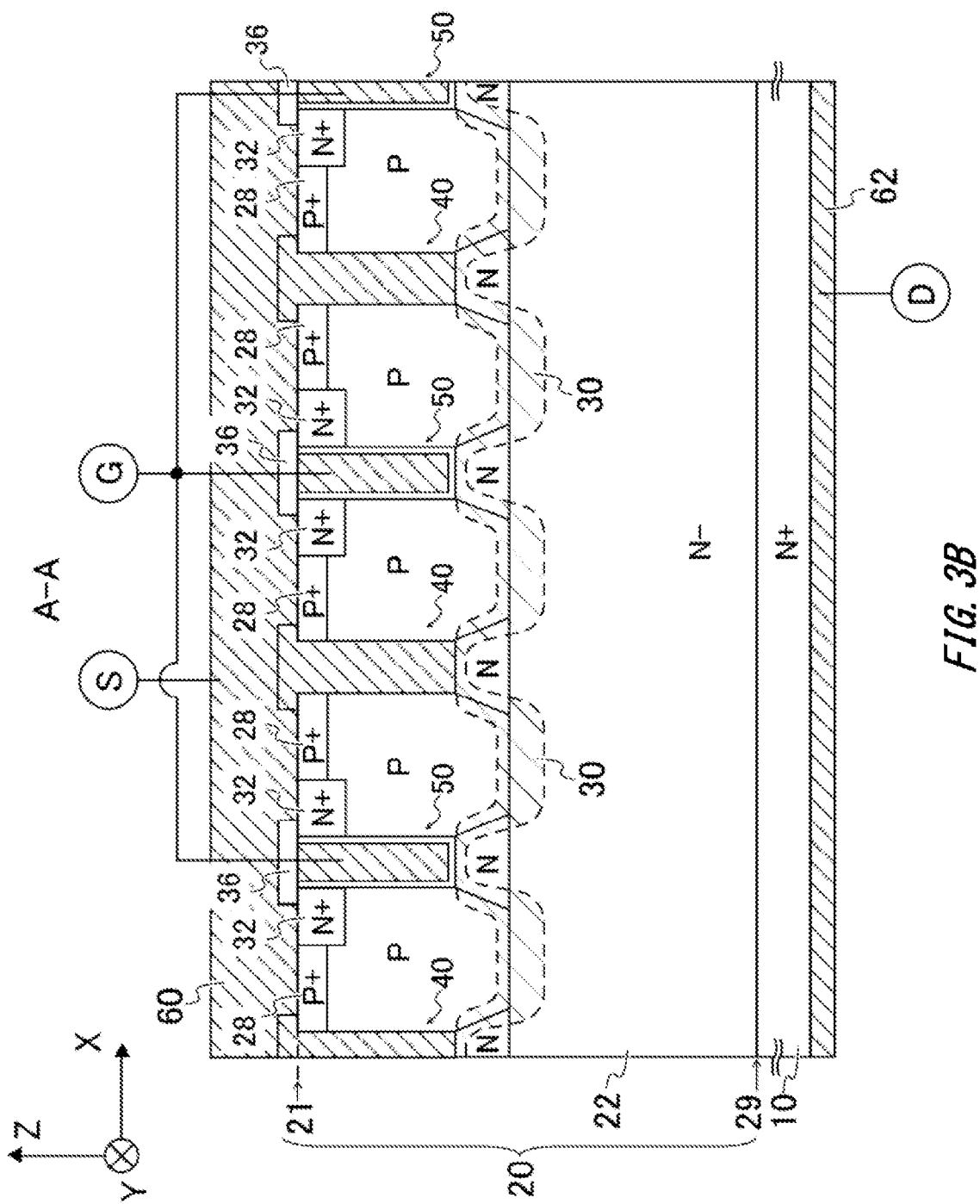
FIG. 3B shows a state in which a reverse bias is applied to a P-N junction portion and a depletion layer 30 spreads over an active region 110 entirely.

FIG. 3B is a drawing showing a state in which the reverse bias is applied to the P-N junction portion and the depletion layer 30 spreads over the active region 110 entirely. FIG. 3B shows that $V_S<V_D$ and shows the gate-off state. Note that in FIG. 3B, an area in which the depletion layer 30 spreads is shown by broken lines. As described above, bottoms of the trench portions (the diode trench portion 40 and the gate trench portion 50) are provided at positions shallower than the bottom 27-1 of the well region 26-1. Accordingly, when the reverse bias is applied to the P-N junction portion, because the depletion layer 30 easily spreads in the SBD region 130 and the MOSFET region 150, the breakdown voltage can be improved.

Figure 4:
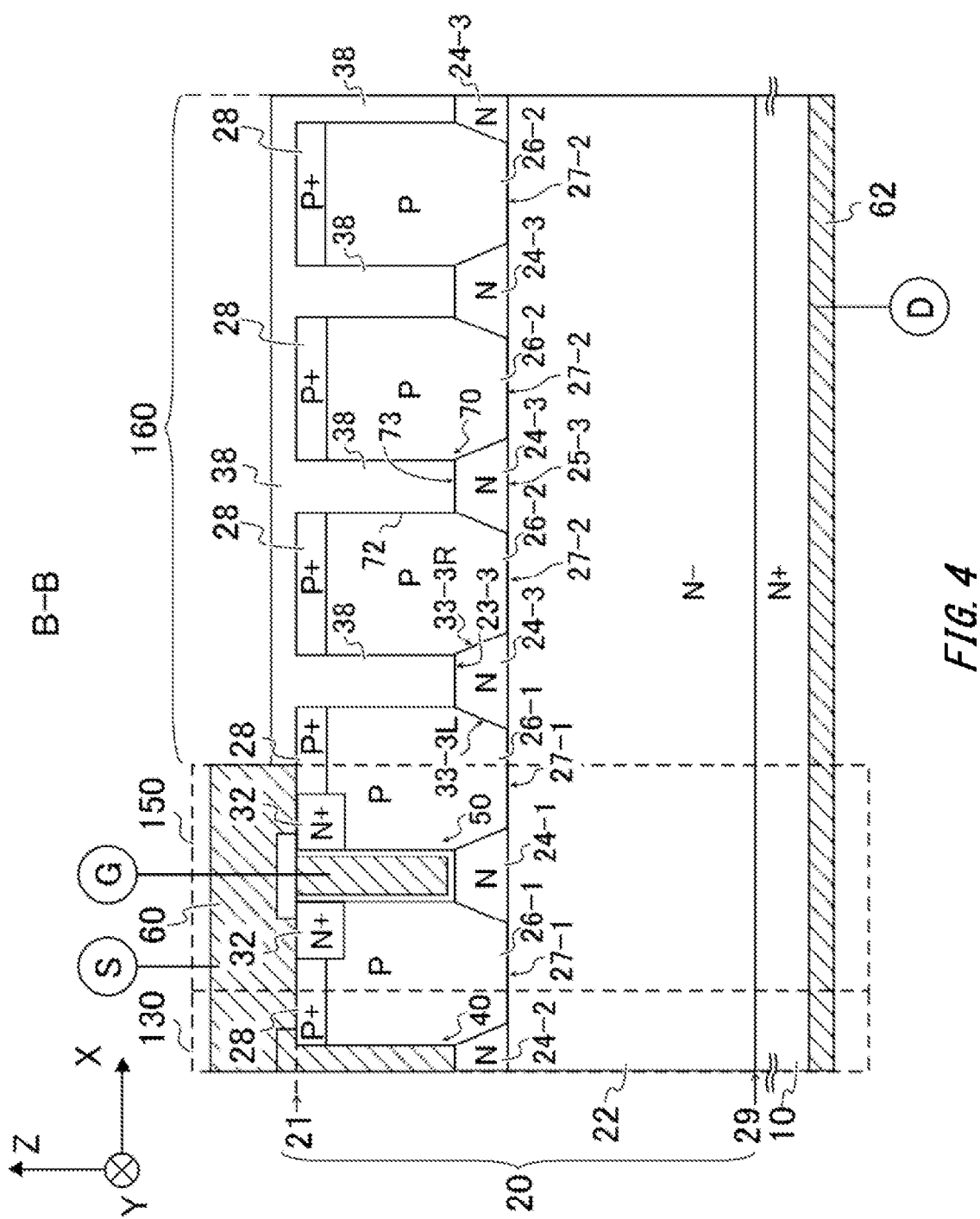
FIG. 4 shows a cross section B-B of FIG. 1 in the first embodiment.

FIG. 4 is a drawing showing a cross section B-B of FIG. 1 in the first embodiment. The cross section B-B is a cross section passing through the active region 110 and the edge termination region 160 and being parallel to the X-Z plane. The edge termination region 160 at least includes the N type upper drift region 24-3, the P type well region 26-2, the P+ type contact region 28, the insulating film 38 and the edge trench portion 70. The well region 26-2 is one example of the second well region, and the upper drift region 24-3 is one example of the third upper drift region. The well region 26-2 may be formed by the same step as that of the well region 26-1, and the upper drift region 24-3 may be formed by the same step as that of the upper drift regions 24-1 and 24-2.

On the cross section B-B, the edge trench portion 70 is provided to be spaced from the diode trench portion 40 and the gate trench portion 50 in the X-axis direction. The edge trench portion 70 is provided in direct contact with the well region 26-2 and between two well regions 26-2. Also, the edge trench portion 70 in the present example is provided from the upper surface 21 of the GaN layer 20 to a position shallower than the bottom 27-2 of the well region 26-2.

The edge trench portion 70 of the present example has an edge trench 72, and an insulating film 38 that is in contact with a bottom 73 and side walls of the edge trench 72 and that is filled inside the edge trench 72. The insulating film 38 in the present example is a film formed by a step different from that of the interlayer dielectric film 36. The insulating film 38 may be an insulating film that is made of the same material as and has the same composition as those of the interlayer dielectric film 36, and may also be an insulating film that is made of a different material from and has a different composition from those of the interlayer dielectric film 36.

The bottom 73 of the edge trench portion 70 may be connected to an upper portion 23-3 of the upper drift region 24-3. For that reason, the insulating film 38 may also be connected to the upper portion 23-3 of the upper drift region 24-3. Also, the lower drift region 22 may be connected to a bottom 25-3 of the upper drift region 24-3.

In the edge termination region 160, the well region 26-2 and the contact region 28 may be provided annularly so as to surround the active region 110. The edge termination region 160 in the present example has an annular guard ring structure. In the edge termination region 160 in the present example, the well region 26-2 and the contact region 28 have floating potential electrically isolated from the source electrode 60. When the reverse bias is applied to the P-N junction portion, the depletion layer 30 generated in the active region 110 spreads outward (in the X-axis positive direction in the example of FIG. 4) within the edge termination region 160, thereby reducing the electric field concentration in the active region 110.

Figure 5:
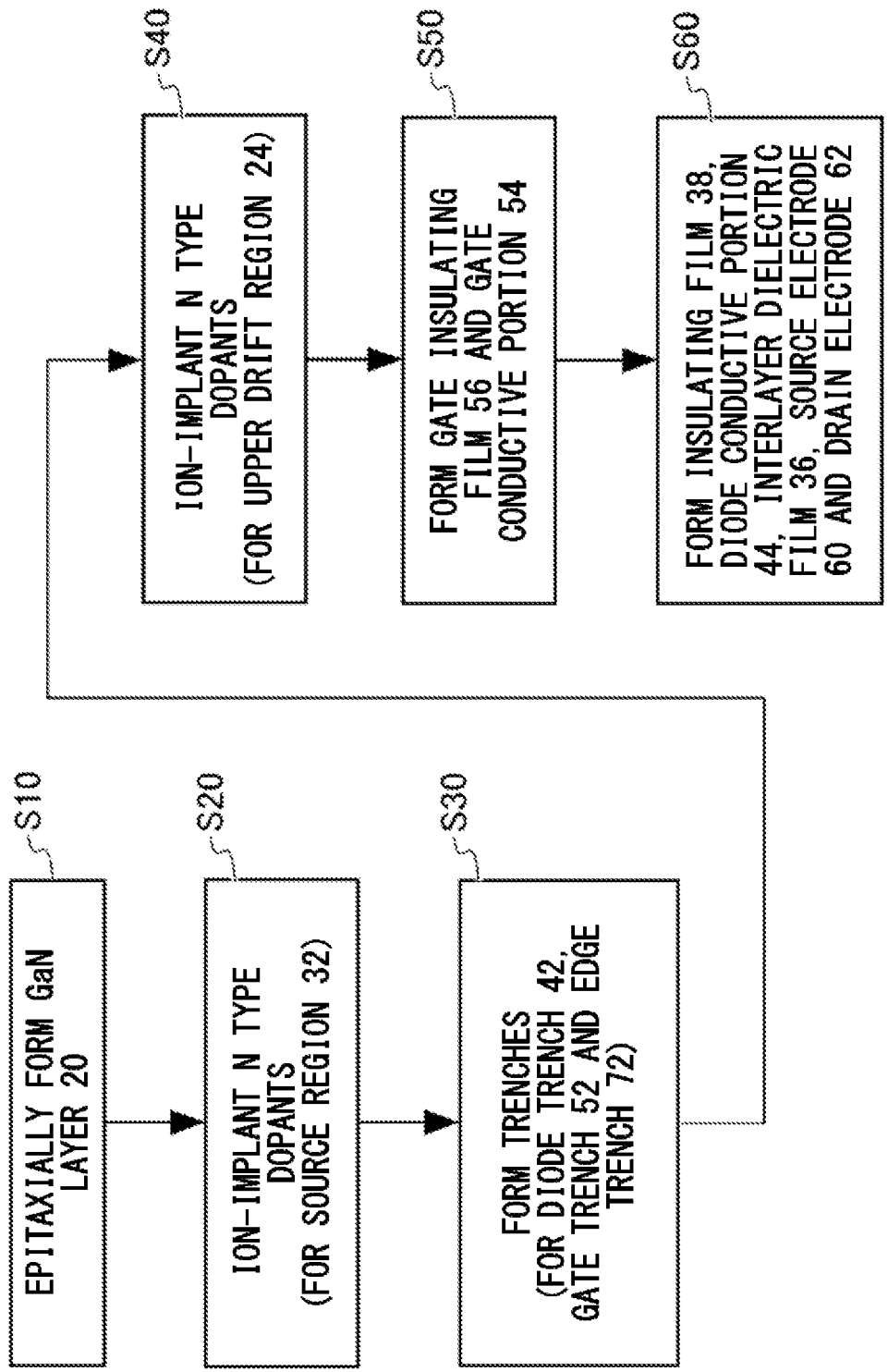
FIG. 5 shows a flow chart of a method of manufacturing the vertical GaN-MOSFET 100.

FIG. 5 is a flow chart showing a method of manufacturing the vertical GaN-MOSFET 100. In the present example, Steps S10 to S60 are performed in this order. Note that a proper modification may also be made to each processing in each step. In the present example, the GaN layer 20 is annealed in each of Steps S20 and S40 to activate dopants implanted in each of Steps S20 and S40; however, in another example, the GaN layer 20 containing dopants implanted in Steps S20 and S40 may also be annealed in Step S40.

Figure 6:
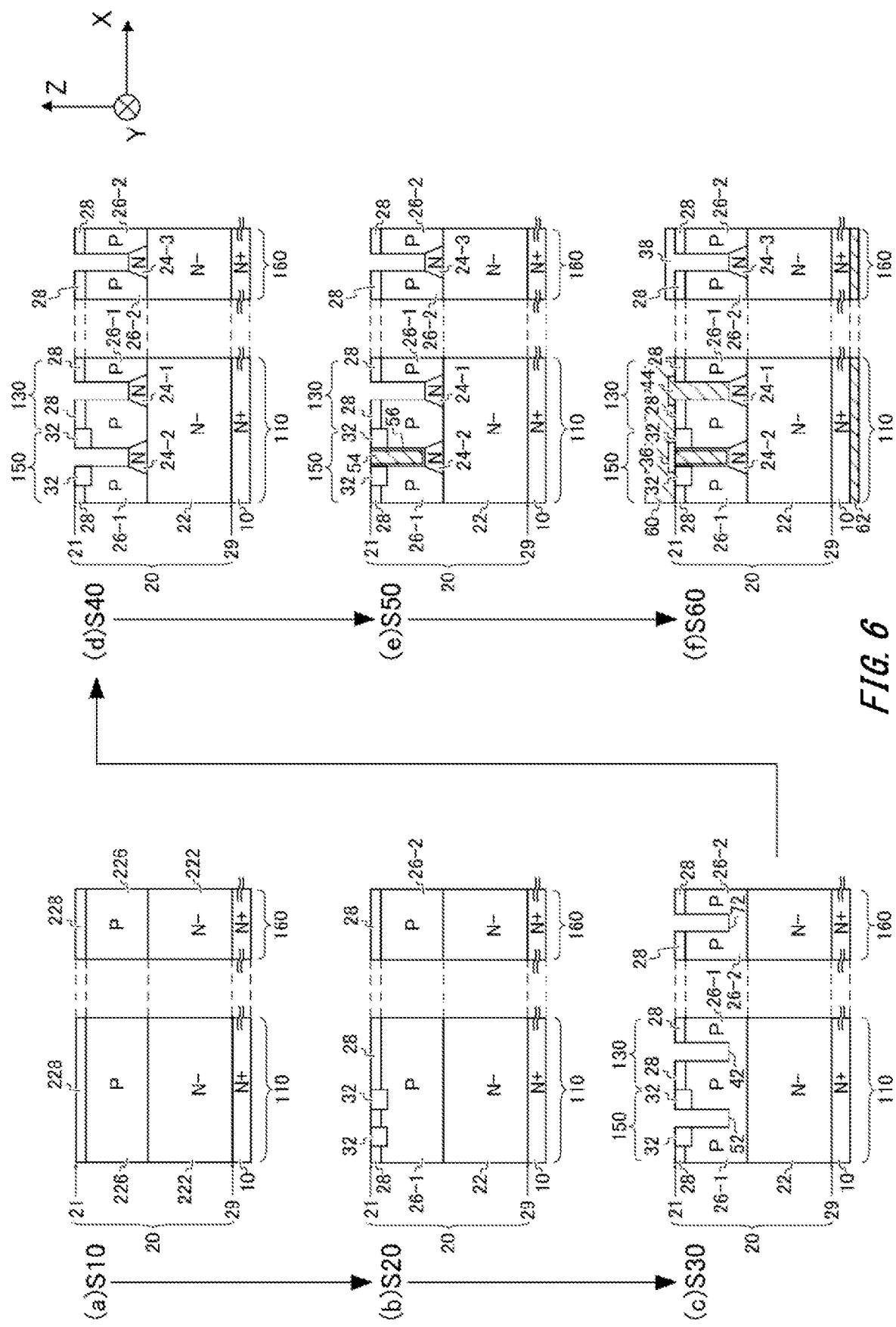
FIG. 6 shows respective steps, shown as (a) to (f), of the manufacturing method.

FIG. 6 is a drawing showing the respective steps, shown as (a) to (f), of the manufacturing method. Note that in (a) to (f) shown in FIG. 6, to facilitate understanding, a cross section of each unit cell of each of the SBD region 130, the MOSFET region 150 and the edge termination region 160 is shown.

(a) shown in FIG. 6 is Step S10 of epitaxially forming the GaN layer 20. In Step S10, first, the N-type GaN layer 222 corresponding to the lower drift region 22 is epitaxially formed on the GaN substrate 10. Next, on the N-type GaN layer 222, the P type GaN layer 226 corresponding to the well region 26 is epitaxially formed. Subsequently, on the P type GaN layer 226, the P+ type GaN layer 228 corresponding to the contact region 28 is epitaxially formed. The N-type GaN layer 222 is one example of a first GaN layer, and the P type GaN layer 226 is one example of a second GaN layer.

The GaN substrate 10 may be a so-called c-surface GaN substrate. A c-axis direction of the GaN substrate 10 may be parallel to the Z-axis direction. Also, the GaN substrate 10 may be a low-dislocation free-standing substrate having a threading dislocation density of less than $1E+7$ cm$^{-2}$. The GaN substrate 10 in the present example has a thickness of 350 μm in the Z-axis direction.

The epitaxial layer may be formed by a Metal Organic Chemical Vapor Deposition (MOCVD) method. Instead of the MOCVD method, each epitaxial layer may also be formed by a Hydride Vapor Phase Epitaxy (HVPE) method.

In the present example, the MOCVD method is adopted. In the present example, to form the N-type GaN layer 222, raw material gas including each gas of trimethylgallium (($CH_3$)$_3$Ga, hereinafter, abbreviated to TMG), ammonia ($NH_3$) and monosilane ($SiH_4$), and pressing gas including nitrogen ($N_2$) gas and hydrogen ($H_2$) gas are made to flow on the GaN substrate 10. At this time, a temperature of the GaN substrate 10 may be set to 1100° C. Note that Si element of monosilane may serve as the N type dopant. The N-type GaN layer 222 may have a thickness of equal to or greater than 4 μm and equal to or less than 100 μm, and may have an N type dopant concentration of equal to or greater than 1E+15 $cm^{-3}$ and equal to or less than 5E+16 $cm^{-3}$, although the thickness and the concentration also depend on the breakdown voltage of the vertical GaN-MOSFET 100. Note that E means power of 10, and 1E+15 means $1\times10^{15}$. Note that the N-type GaN layer 222 may correspond to the lower drift region 22, and in the present example, the N-type GaN layer 222 and the lower drift region 22 correspond to each other on one-to-one basis.

Also, in the present example, to form the P type GaN layer 226, raw material gas including each gas of TMQ ammonia and bis(cyclopentadienyl)magnesium ($Cp_2Mg$), and the pressing gas including nitrogen gas and hydrogen gas are made to flow on the N-type GaN layer 222. At this time, the temperature of the GaN substrate 10 may be set to 1050° C. Note that Mg of $Cp_2Mg$ may serve as the P type dopant in the P type GaN layer 226. The P type GaN layer 226 may have a thickness of equal to or greater than 0.5 μm and equal to or less than 2 μm, and may have a P type dopant concentration of equal to or greater than 5E+16 $cm^{-3}$ and equal to or less than 1E+18 $cm^{-3}$.

Further, in the present example, to form the P+ type GaN layer 228, the raw material gas including each gas of TMQ ammonia and $Cp_2Mg$, and the pressing gas including nitrogen gas and hydrogen gas are made to flow on the P type GaN layer 226. At this time, the temperature of the GaN substrate 10 may be set to 1050° C. Note that by making the $Cp_2Mg$ concentration higher compared to the case of forming the P type GaN layer 226, the P+ type GaN layer 228 having a higher P type dopant concentration than that of the P type GaN layer 226 can be formed. The P+ type GaN layer 228 may have a thickness of equal to or greater than 0.02 μm and equal to or less than 0.2 μm, and may have a P type dopant concentration of equal to or greater than 1E+19 $cm^{-3}$ and equal to or less than 1E+20 $cm^{-3}$.

After the MOCVD step, a laminate including the GaN substrate 10 and the GaN layer 20 may be taken out of the MOCVD device and be moved to a thermal treatment device. To activate the N type and P type dopants in the GaN layer 20, the laminate may be annealed in the thermal treatment device. Note that a cap layer being AlN (aluminum nitride) layer may be provided on the upper surface 21 of the GaN layer 20 and be annealed. Accordingly, nitrogen decomposition in the P+ type GaN layer 228 can be reduced. In the present example, in the nitrogen gas atmosphere containing oxygen gas, a thermal treatment is performed on the laminate at 650° C. for 30 minutes. The laminate may be taken out of the thermal treatment device and the cap layer thereon may be removed by using KOHaq (potassium hydroxide aqueous solution) and the like. Accordingly, Step S10 is terminated.

(b) shown in FIG. 6 is Step S20 of ion-implanting N type dopants from the upper surface 21 to a predetermined depth to form the source region 32. In the present example, first, a resist mask having an opening corresponding to the source region 32 is formed. Subsequently, by using an ion implantation device, Si is ion-implanted into the GaN layer 20 region corresponding to the opening of the resist mask.

Next, after removing the resist mask, the laminate including the GaN substrate 10 and the GaN layer 20 is moved to the thermal treatment device. Then, to activate the implanted Si, the laminate is annealed in the nitrogen gas atmosphere at 1000° C. for 10 minutes. After annealing, an etching treatment may also be performed on the upper surface 21 by using dilute hydrofluoric acid to remove an oxide layer from the upper surface 21. Subsequently, the upper surface 21 may be rinsed by pure water. Accordingly, the source region 32 may be formed, the source region 32 having a depth, from the upper surface 21, of equal to or greater than 0.05 μm and equal to or less than 0.2 μm and having an N type dopant concentration of equal to or greater than 5E+18 $cm^{-3}$ and equal to or less than 1E+20 $cm^{-3}$.

(c) shown in FIG. 6 is Step S30 of forming a trench by etching. In the present example, first, resist masks are formed, each of the resist masks having an opening respectively corresponding to the diode trench 42, the gate trench 52 and the edge trench 72. Subsequently, by using the etching device, the GaN layer 20 is etched from the upper surface 21 to a predetermined depth through the resist masks. Accordingly, in the regions in the GaN layer 20 respectively corresponding to the openings of the resist masks, the diode trench 42, the gate trench 52 and the edge trench 72 are formed, each having a depth, from the upper surface 21, of equal to or greater than 0.5 μm and equal to or less than 2.0 μm.

In the present example, each trench is provided from the upper surface 21 to a position shallower than the bottom of the P type GaN layer 226. That is, the bottom of each trench does not reach the N-type GaN layer 222 (the lower drift region 22). The bottom of each trench and the N-type GaN layer 222 (the lower drift region 22) may be spaced from each other by a predetermined length, for example, are spaced from each other by a length of equal to or greater than 0.02 μm and equal to or less than 0.2 μm.

Note that in another example, to improve Schottky property between the diode conductive portion 44 and the upper drift region 24-1 (that is, to reduce the forward-direction voltage $V_F$), the N+ type GaN region may also be provided on the upper portion 23-1 of the upper drift region 24-1. Note that in this case, although the forward-direction voltage $V_F$ can be reduced, leakage current of SBD increases. Here, instead of the N+ type GaN region, the N-type GaN region may also be adopted. Note that in a case where the N-type GaN region is adopted, although the leakage current of SBD can be reduced, the forward-direction voltage $V_F$ increases. For that reason, any one of the N+ type GaN region and N-type GaN region may be adopted in accordance with the device characteristics.

(d) shown in FIG. 6 is Step S40 of implanting the N type dopants between each trench and the N-type GaN layer 222 to form the upper drift region 24. In Step S40, the resist masks with the openings used in Step S30 may be used again. In the present example, by ion implantation of the N type dopants, parts of the P type well region 26 are counter-doped. Subsequently, the laminate is annealed at the thermal treatment device. Accordingly, the upper drift region 24 having the N type dopant concentration of equal to or greater than 5E+16 $cm^{-3}$ and equal to or less than 5E+17 $cm^{-3}$ is formed.

(e) shown in FIG. 6 is Step S50 of forming the gate insulating film 56 and the gate conductive portion 54. In the present example, first, oxide is deposited by a plasma CVD method. The gate insulating film 56 may be silicon oxide ($SiO_2$) or aluminum oxide ($Al_2O_3$). After forming the gate insulating film 56, the gate conductive portion 54 is formed by sputtering. The gate conductive portion 54 may be formed by aluminum (Al). Instead of this, by the CVD method, the gate conductive portion 54 of polysilicon containing the dopants may also be formed. Subsequently, the gate insulating film 56 and the gate conductive portion 54 may be respectively patterned by etching.

(f) shown in FIG. 6 is Step S60 of forming the insulating film 38 inside the edge trench 72, forming the diode conductive portion 44 inside the diode trench 42, and further subsequently, forming the interlayer dielectric film 36, the source electrode 60 and the drain electrode 62. In the present example, first, the insulating film 38 is formed by spin coating and the like so as to fill inside the edge trench 72. The insulating film 38 may be formed of one or more types of materials of Boro-phospho Silicate Glass (BPSG), Phosphorus Silicate Glass (PSG) and Borosilicate Glass (BSG).

Next, the diode conductive portion 44 is provided inside the diode trench portion 40 so as to fill inside the diode trench 42. If the diode conductive portion 44 is joined to the upper drift region 24-1, the diode conductive portion 44 may be a metal conductive portion having a larger work function than that of the source electrode 60. The diode conductive portion 44 may be formed of nickel (Ni), palladium (Pd), gold (Au) or platinum (Pt). Subsequently, in the same manner as that of the insulating film 38, the interlayer dielectric film 36 is formed. The patterning treatment may be performed on the interlayer dielectric film 36 so that the interlayer dielectric film 36 is left only on the upper portion of the gate trench portion 50. Next, the source electrode 60 and the drain electrode 62 are formed. In the present example, the source electrode 60 is one example of an ohmic electrode layer.

The source electrode 60 is provided on the diode trench portion 40 and the gate trench portion 50. The source electrode 60 in the present example is in contact with the diode conductive portion 44 and the P+ type contact region 28 that is exposed on the upper surface 21. The source electrode 60 may have a lamination structure including a titanium (Ti) layer as a lower layer and an aluminum layer as an upper layer. This lamination structure may be considered to be ohmic-connected to the contact region 28 of the GaN layer 20. Note that the drain electrode 62 may also have a lamination structure including the titanium layer that is in contact with the GaN substrate 10 and the aluminum layer that is in contact with the titanium layer. The lamination structure may also be a Ti/Al/Ni/Au lamination structure formed by further laminating a nickel layer and a gold layer on the titanium layer and the aluminum layer. After depositing and forming each metal layer by the sputtering method, each metal layer may be patterned by etching.

Figure 7:
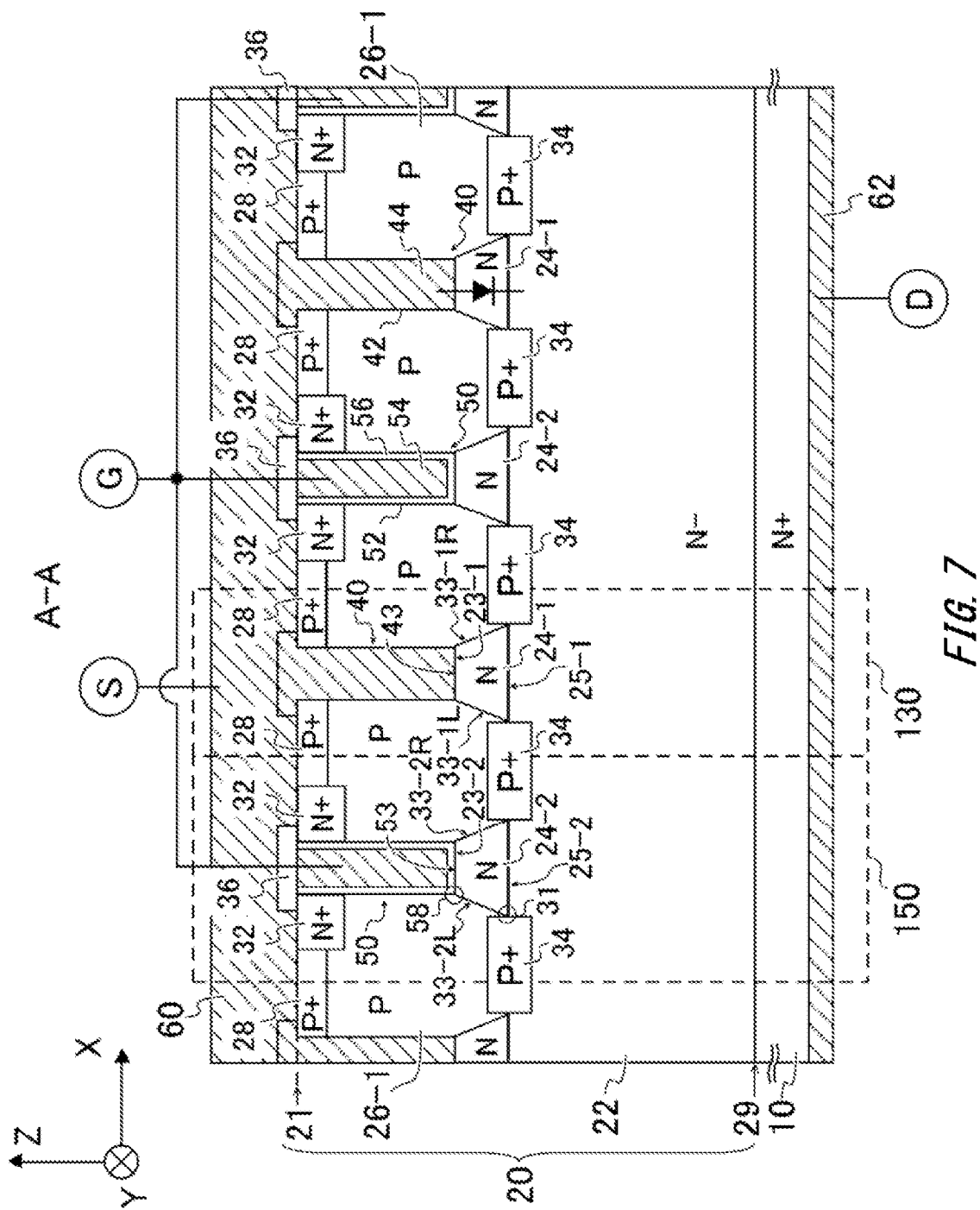
FIG. 7 shows the cross-section A-A of FIG. 1 in a second embodiment.

FIG. 7 is a drawing showing the cross-section A-A of FIG. 1 in a second embodiment. The GaN layer 20 in the present example further has a P+ type embedded region 34 between the well region 26-1 and the lower drift region 22. The present example is different from the first embodiment in the said respect. By providing the embedded region 34, the depletion layer 30 easily spreads in the upper drift region 24-1 below the diode trench portion 40 when the reverse bias is applied to the P-N junction portion. Accordingly, compared to the first embodiment, the breakdown voltage of the active region 110 can be improved. That is, the avalanche capability can be improved. Also, by providing the embedded region 34, the leakage current flowing through the diode conductive portion 44 during the gate-off period can be reduced.

In the MOSFET region 150 in the present example, portions at which the embedded region 34 is in contact with the upper drift regions 24-1 and 24-2 are corners 31 of the bottom 27-1 of the well region 26-1. In the same manner as that of the first embodiment, the corner 31 in the present example is also at a position deeper than the corner 58 of the gate trench portion 50 in the Z-axis direction. For that reason, in the same manner as that of the first embodiment, the breakdown of the gate insulating film 56 and an undesirable turned-on state of the parasitic PNP transistor can be surely prevented from occurring.

Note that in the GaN layer 20 of the edge termination region 160 as well, the embedded region 34 may be provided between the well region 26-2 and the lower drift region 22. Accordingly, compared to the first embodiment, the present example is advantageous in that the depletion layer 30 more easily spreads in the edge termination region 160.

Figure 8:
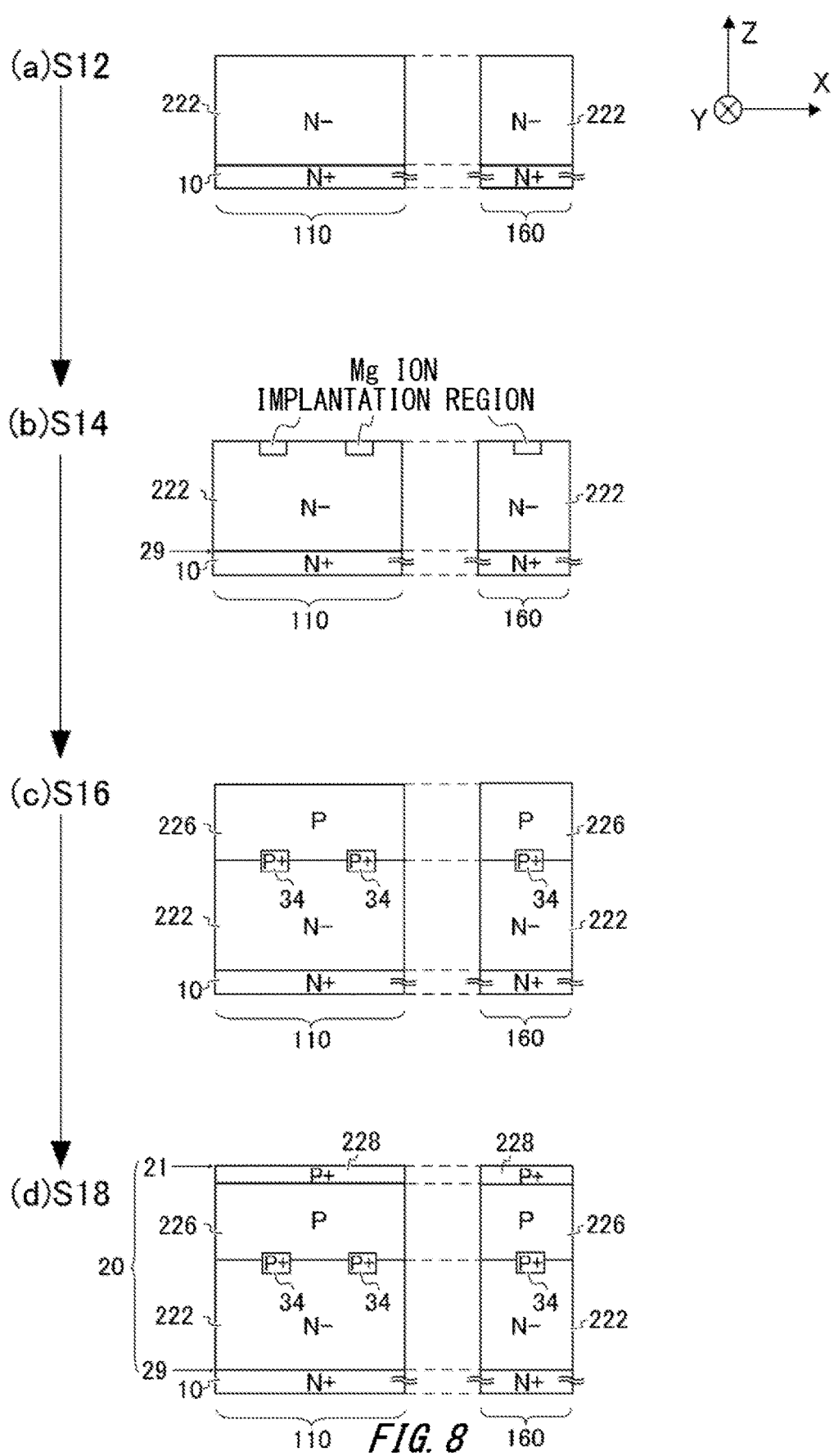
FIG. 8 shows details, shown as (a) to (d), of Step S10 in the second embodiment.

(a) to (d) shown in FIG. 8 show the details of Step S10 in the second embodiment. Step S10 of the present example includes Steps S12, S14, S16 and S18 in this order. (a) shown in FIG. 8 is Step S12 of epitaxially forming the N-type GaN layer 222. Because Step S12 is the same as the contents described for (a) shown in FIG. 6, the details are omitted here.

(b) shown in FIG. 8 is Step S14 of ion-implanting P type dopants from the upper surface of the N-type GaN layer 222. In the present example, first, resist masks are formed, each having an opening corresponding to the embedded region 34. Subsequently, by using an ion implantation device, Mg is ion-implanted into regions of the N-type GaN layer 222, the regions respectively corresponding to the openings of the resist masks. Next, the resist masks are removed and a cap layer being AlN and the like is formed on the entire upper surface of the N-type GaN layer 222. Subsequently, the laminate including the GaN substrate 10 and the N-type GaN layer 222 is moved to a thermal treatment device, and the laminate is annealed to activate Mg. After annealing, the cap layer may be removed.

(c) shown in FIG. 8 is Step S16 of epitaxially forming the P type GaN layer 226. Because Step S16 is the same as the contents described for (a) show in FIG. 6, the details are omitted here. In the Step S16, a partial region in the P type GaN layer 226 in contact with the Mg ion implantation region within the N-type GaN layer 222 may be considered as the embedded region 34 having the P type dopants with a higher concentration than that of other regions in the P type GaN layer 226. That is, the embedded region 34 may be provided across a boundary between the N-type GaN layer 222 and the P type GaN layer 226 in the Z-axis direction. The embedded region 34 may have the P type dopant concentration of equal to or greater than $5E+17$ $cm^{-3}$ and equal to or less than $2E+19$ $cm^{-3}$. (d) shown in FIG. 8 is Step S18 of epitaxially forming the P+ type GaN layer 228. Because Step S18 is the same as the contents described for (a) shown in FIG. 6, the details are omitted here.

Figure 9:
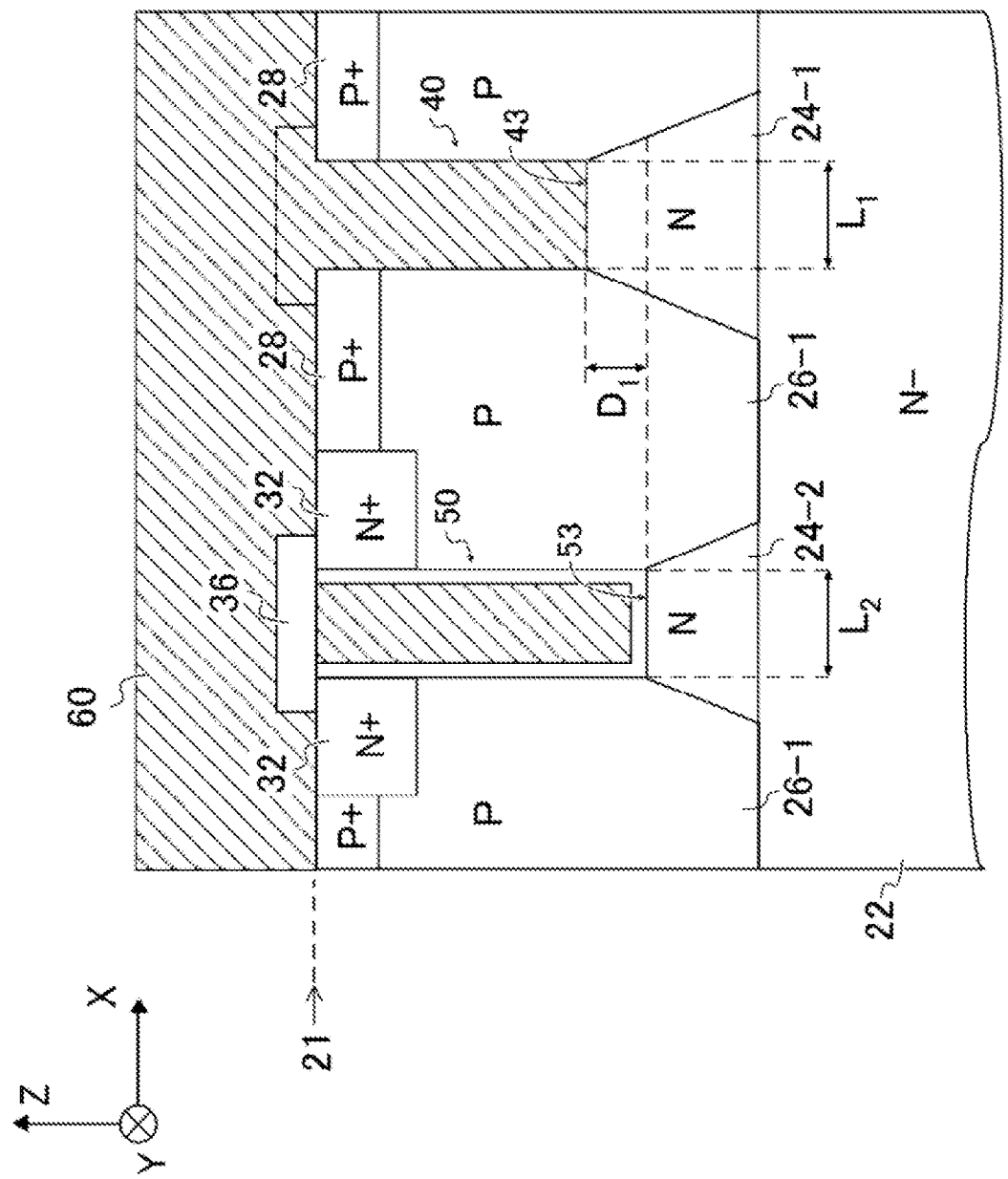
FIG. 9 shows the cross-section A-A of FIG. 1 in a third embodiment.

FIG. 9 is a drawing showing the cross-section A-A of FIG. 1 in a third embodiment. In the present example, the bottom 43 of the diode trench portion 40 is provided at a position shallower than the bottom 53 of the gate trench portion 50 in the Z-axis direction. That is, the bottom 43 in the present example is provided at a position closer to the upper surface 21 than the bottom 53. A difference $D_1$ between the bottom 43 and the bottom 53 in the Z-axis direction may be in a range from several nm to several dozen nm. The present embodiment is different from the first embodiment in the said respect.

In the present example, a width $L_1$ of the bottom 43 of the diode trench portion 40 in the X-axis direction is smaller than a width $L_2$ of the bottom 53 of the gate trench portion 50 in the X-axis direction. For that reason, compared to the first embodiment, the depletion layer 30 more easily spreads in a region which is directly below the diode trench portion 40 and is between two well regions 26-1. Because the SBD region 130 is more easily pinched off when the reverse bias is applied to the P-N junction portion, the leakage current in the forward direction in the SBD region 130 can be reduced.

In the present example, in the above-described Step S30, the GaN layer 20 is etched so that the depth of the diode trench 42 is different from that of the gate trench 52. Next, in the above-described Step S40, the N type dopants are ion-implanted to form the upper drift region 24-1 and the upper drift region 24-2. At this time, because the implantation depths in the upper drift regions 24-1 and 24-2 are different, the N type dopants may be ion-implanted sequentially under different implantation conditions. At least any one condition of acceleration energy and a dosage concentration may be different. Note that certainly the present example may also be combined with the second embodiment.

Figure 10:
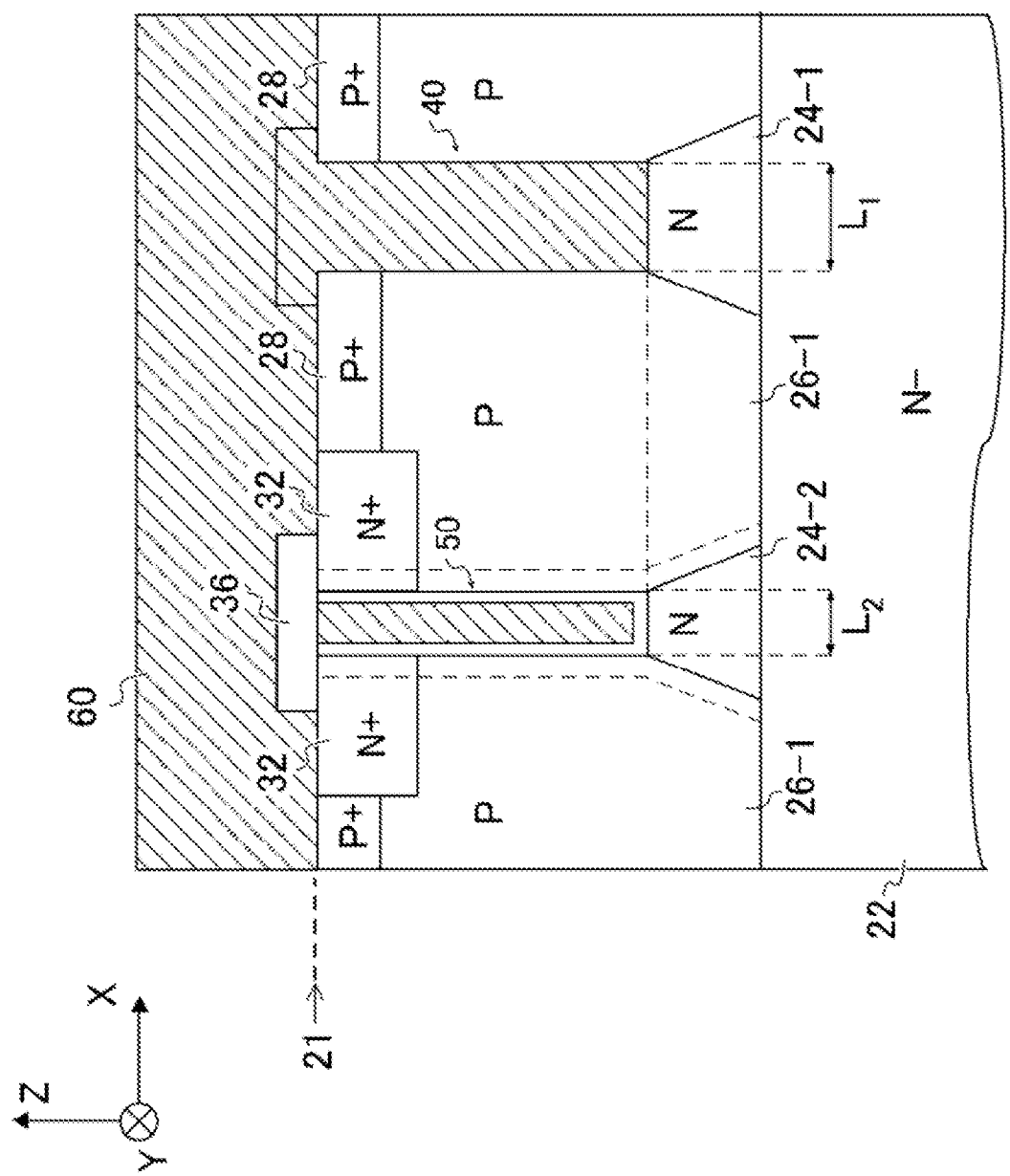
FIG. 10 shows the cross-section A-A of FIG. 1 in a fourth embodiment.

FIG. 10 is a drawing showing the cross-section A-A of FIG. 1 in a fourth embodiment. In the present example, the bottom 43 of the diode trench portion 40 is provided at the same position as that of the bottom 53 of the gate trench portion 50 in the Z-axis direction (shown by the broken lines). Note that in the present example, a width $L_1$ of the diode trench portion 40 in the X-axis direction may be larger than a width $L_2$ of the gate trench portion 50 in the X-axis direction. In the present example, in the above-described Step S30, the GaN layer 20 is etched by using the resist masks, each having the opening that is different from one to another and that respectively corresponds to the diode trench 42 and the gate trench 52. In this way, by making the width of the diode trench portion 40 in the X-axis direction large, the holes passing through the diode conductive portion 44 when the avalanche breakdown occurs at the P-N junction portion can be easily released to the source electrode 60. Note that when the avalanche breakdown occurs, the drain electrode 62 may serve as an electron suction port.

Also, in the X-axis direction, the width $L_2$ of the upper drift region 24-2 connected to the bottom 53 of the gate trench portion 50 is smaller than the width $L_1$ of the upper drift region 24-1 connected to the bottom 43 of the diode trench portion 40. Accordingly, compared to a case where the width $L_2$ of the gate trench portion 50 in the X-axis direction is set to be the same as the width $L_1$ of the diode trench portion 40 in the X-axis direction, when the reverse bias is applied to the P-N junction portion, the depletion layer 30 more easily spreads in the upper drift region 24-2 that is directly below the gate trench portion 50. For that reason, compared to the first embodiment, the gate insulating film 56 can be more surely protected. Note that certainly the present example may be also combined with at least any one of the second embodiment and the third embodiment.

Figure 11:
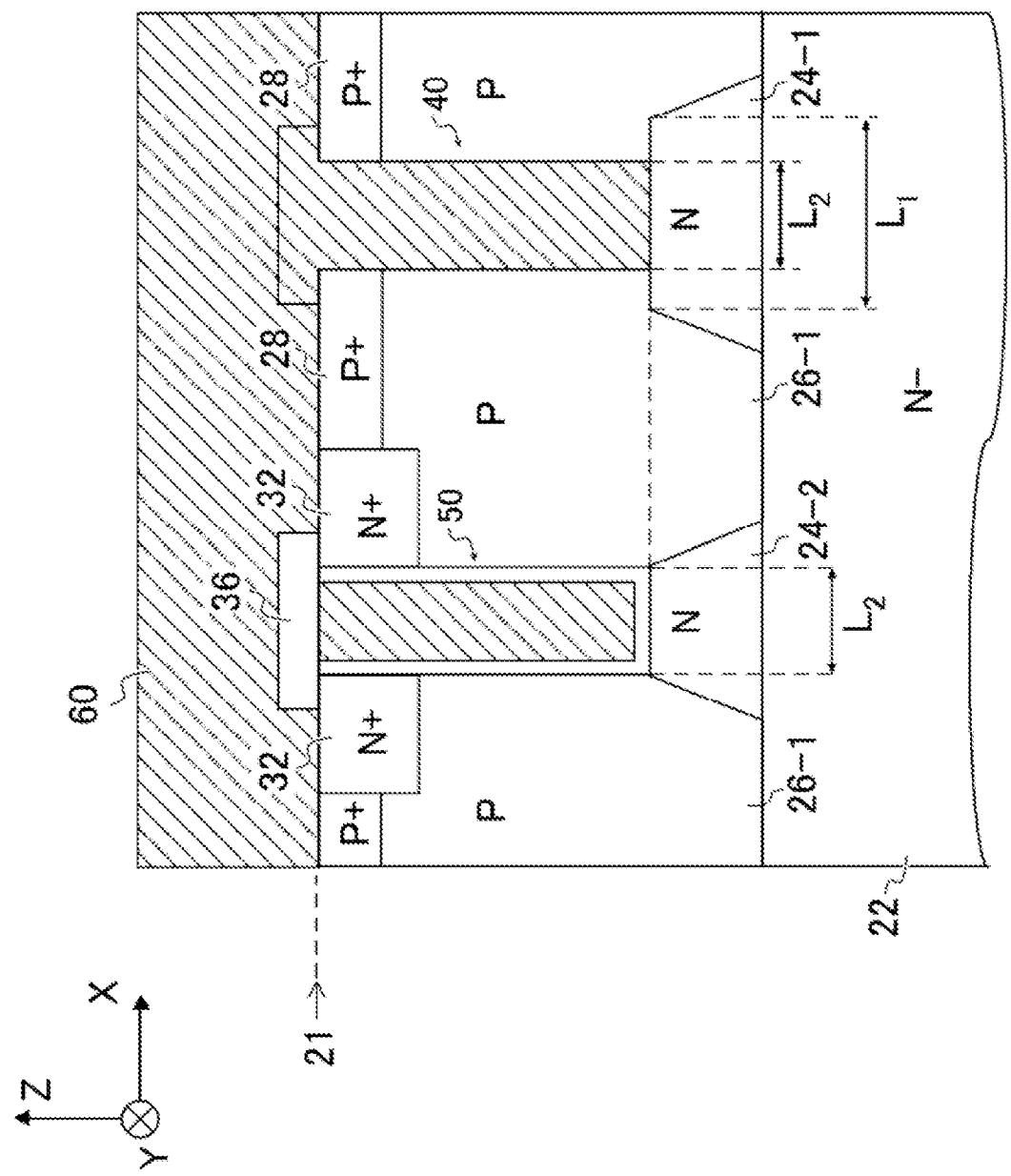
FIG. 11 shows the cross-section A-A of FIG. 1 in a fifth embodiment.

FIG. 11 is a drawing showing the cross-section A-A of FIG. 1 in a fifth embodiment. In the present example, although the widths of the gate trench portion 50 and the diode trench portion 40 in the X-axis direction are both the width $L_2$ and the same as each other, the width $L_2$ of the upper drift region 24-2 may be smaller than the width $L_1$ of the upper drift region 24-1. The present example is different from the fourth embodiment in the said respect. In the above-described Step S40, the upper drift region 24-2 may be formed by setting a dose amount applied to a region directly below the diode trench portion 40 to be greater than a dose amount applied to a region directly below the gate trench portion 50. In the present example as well, compared to the first embodiment, the gate insulating film 56 can be more surely protected. Also, compared to the first embodiment, a contact area between the well region 26-1 and the upper drift region 24-2 can be increased. For that reason, compared to the first embodiment, because the depletion layer 30 more easily spreads, the avalanche capability can be improved. Note that certainly the present example may be also combined with at least any one of the second embodiment and the third embodiment.

Figure 12:
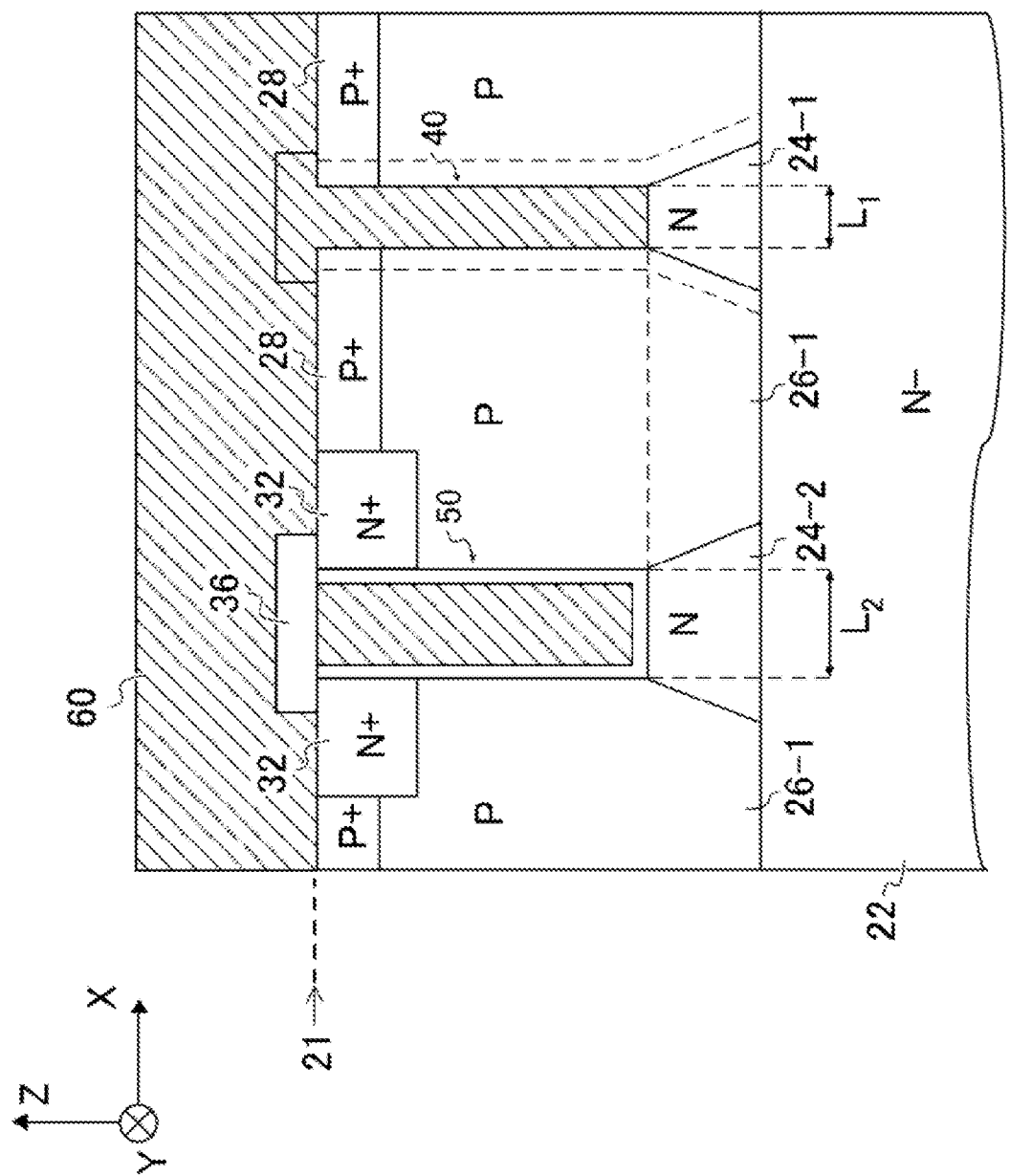
FIG. 12 shows the cross-section A-A of FIG. 1 in a sixth embodiment.

FIG. 12 is a drawing showing the cross-section A-A of FIG. 1 in a sixth embodiment. In the present example, in the X-axis direction, the width $L_1$ of the diode trench portion 40 is smaller than the width $L_2$ of the gate trench portion 50. The present example is different from the first embodiment in the said respect. In the present example, when the reverse bias is applied to the P-N junction portion, the depletion layer 30 easily spreads in the upper drift region 24-1 that is directly below the diode trench portion 40. For that reason, because the SBD region 130 is easily pinched off, the leakage current in the SBD region 130 can be reduced. Note that certainly the present example may also be combined with at least any one of the second embodiment and the third embodiment. By combining the present example with at least any one of the second embodiment and the third embodiment, a further high effect of leakage current reduction can be obtained.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by a device, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A vertical semiconductor device having a gallium nitride substrate of a first conductivity type and a gallium nitride layer provided on the gallium nitride substrate, the vertical semiconductor device comprising:
   a transistor region; and
   a Schottky diode region that is in direct contact with the transistor region, wherein
   the vertical semiconductor device has, in the gallium nitride layer in the Schottky diode region:
   a first well region of a second conductivity type;
   a diode trench portion that is in direct contact with the first well region in an array direction in which the transistor region and the Schottky diode region are arrayed and that is provided from an upper surface of the gallium nitride layer to a position shallower than a bottom of the first well region;

a first upper drift region of a first conductivity type that is connected to a bottom of the diode trench portion;

a lower drift region of a first conductivity type that is connected to the bottom of the first well region and to a bottom of the first upper drift region; and a conductive portion that is provided inside the diode trench portion and that is connected to an upper portion of the first upper drift region.

2. The vertical semiconductor device according to claim 1, wherein the vertical semiconductor device has, in the gallium nitride layer in the transistor region:

a gate trench portion that is spaced from the diode trench portion in the array direction, that is in direct contact with the first well region and that is provided from the upper surface of the gallium nitride layer to a position shallower than the bottom of the first well region; and a second upper drift region of a first conductivity type that is connected to a bottom of the gate trench portion, and the lower drift region is also connected to a bottom of the second upper drift region.

3. The vertical semiconductor device according to claim 2, wherein the bottom of the diode trench portion is provided, in a depth direction of the gallium nitride layer, at a position closer to the upper surface of the gallium nitride layer than the bottom of the gate trench portion.

4. The vertical semiconductor device according to claim 2, wherein the bottom of the diode trench portion is provided, in a depth direction of the gallium nitride layer, at a position identical to that of the bottom of the gate trench portion.

5. The vertical semiconductor device according to claim 2, wherein a width of the diode trench portion is larger than a width of the gate trench portion in the array direction.

6. The vertical semiconductor device according to claim 2, wherein a width of the second upper drift region connected to the bottom of the gate trench portion is smaller than a width of the first upper drift region connected to the bottom of the diode trench portion in the array direction.

7. The vertical semiconductor device according to claim 2, wherein a width of the diode trench portion is smaller than a width of the gate trench portion in the array direction.

8. The vertical semiconductor device according to claim 1, wherein the vertical semiconductor device further comprises an ohmic electrode layer that is at least in contact with the diode trench portion and the upper surface of the gallium nitride layer, and the conductive portion provided inside the diode trench portion is a metal conductive portion having a work function larger than that of the ohmic electrode layer.

9. The vertical semiconductor device according to claim 2, wherein the vertical semiconductor device further has an embedded region of a second conductivity type between the first well region and the lower drift region.

10. The vertical semiconductor device according to claim 1, wherein the vertical semiconductor device further comprises an edge termination region provided so as to surround the transistor region and the Schottky diode region in a top view, the gallium nitride layer in the edge termination region has:

a second well region of a second conductivity type;

an edge trench portion that is in direct contact with the second well region in the array direction and that is provided from the upper surface of the gallium nitride layer to a position shallower than a bottom of the second well region;

a third upper drift region of a first conductivity type that is connected to a bottom of the edge trench portion; and an insulating film that is provided inside the edge trench portion and that is connected to the third upper drift region, and the lower drift region is also connected to a bottom of the third upper drift region.

11. A method of manufacturing a vertical semiconductor device having a transistor region and a Schottky diode region in direct contact with the transistor region, the method comprising:

epitaxially forming, on a gallium nitride substrate of a first conductivity type, a gallium nitride layer that at least has a first gallium nitride layer of a first conductivity type and a second gallium nitride layer of a second conductivity type;

etching the gallium nitride layer to form a trench from an upper surface of the gallium nitride layer to a position shallower than a bottom of the second gallium nitride layer;

implanting dopants of a first conductivity type at least between the trench and the first gallium nitride layer to form an upper drift region of a first conductivity type that is connected to a bottom of the trench and an upper portion of the first gallium nitride layer; and forming, inside the trench, a diode conductive portion of the Schottky diode region that is connected to the upper drift region at the bottom of the trench.

* * * * *